(12) United States Patent
Wang et al.

(10) Patent No.: US 7,319,592 B2
(45) Date of Patent: Jan. 15, 2008

(54) RECYCLABLE PROTECTIVE COVER FOR A HEAT-CONDUCTIVE MEDIUM

(75) Inventors: Frank Wang, Taipei (TW); Yi-Lun Cheng, Taipei (TW); Jui-Chan Fan, Taipei (TW); Chun-Yi Chang, Taipei (TW); Chun-Lung Lin, Taipei (TW); Chih-Kai Yang, Taipei (TW)

(73) Assignee: Inventec Corporation, Taipei (TW)

( * ) Notice: Subject to any disclaimer, the term of this patent is extended or adjusted under 35 U.S.C. 154(b) by 109 days.

(21) Appl. No.: 11/401,365

(22) Filed: Apr. 11, 2006

(65) Prior Publication Data

US 2007/0237896 A1 Oct. 11, 2007

(51) Int. Cl.
*H05K 7/20* (2006.01)

(52) U.S. Cl. ............... 361/705; 361/704; 361/708; 165/80.3; 165/185; 257/706; 257/707

(58) Field of Classification Search ........ 361/704–709, 361/710–719; 174/16.1, 16.3; 165/72–75, 165/80.2, 80.3, 80.4, 104.33, 185; 257/706–727; 206/701, 722, 724, 725, 713–717, 460, 813; 106/162.51, 164.01, 172.1, 206.1, 217.01, 106/287.35, 400; 536/102
See application file for complete search history.

(56) References Cited

U.S. PATENT DOCUMENTS

| | | | | |
|---|---|---|---|---|
| 5,897,917 A | * | 4/1999 | Hinshaw et al. ............ 422/258 |
| 6,029,740 A | * | 2/2000 | Lee et al. ..................... 165/76 |
| 6,049,458 A | * | 4/2000 | Lee et al. .................... 361/705 |
| 6,059,116 A | * | 5/2000 | Hinshaw et al. ............ 206/714 |
| 6,644,395 B1 | * | 11/2003 | Bergin ......................... 165/185 |
| 6,935,420 B1 | * | 8/2005 | Dong et al. ................. 165/185 |
| 7,051,790 B2 | * | 5/2006 | Lin ............................ 165/80.2 |
| 7,063,136 B2 | * | 6/2006 | Yu et al. ..................... 165/185 |
| 7,068,514 B2 | * | 6/2006 | Chang et al. ............... 361/705 |
| 2006/0232936 A1 | * | 10/2006 | Wu ............................. 361/704 |
| 2006/0268520 A1 | * | 11/2006 | Huang et al. ............... 361/704 |
| 2007/0012421 A1 | * | 1/2007 | Lin et al. .................... 165/80.2 |

* cited by examiner

*Primary Examiner*—Michael Datskovskiy
(74) *Attorney, Agent, or Firm*—Birch, Stewart, Kolasch & Birch, LLP

(57) ABSTRACT

A protective cover with a heat-conductive medium of a heat sink apparatus is provided, which is used to cover and protect the heat-conductive medium placed at the bottom surface of a base of the heat sink apparatus. It includes a sheet-like board, an elastic wall, and an accommodation chamber, wherein the sheet-like board is concave and located at one side of the protective cover with the heat-conductive medium; the elastic wall is extended along the edge of the sheet-like board so as to provide a clipping force for clipping with the heat sink apparatus; and the accommodation chamber is formed by the concave portion of the sheet-like board to mask and cover the heat-conductive medium; while the sheet-like board is clipped to the heat sink apparatus through the elastic wall, such that the accommodation chamber is used to mask and cover the heat-conductive medium.

14 Claims, 6 Drawing Sheets

RECYCLABLE PROTECTIVE COVER FOR A HEAT-CONDUCTIVE MEDIUM

BACKGROUND OF THE INVENTION

1. Field of Invention

The present invention relates to a structural design of a protective cover for a heat-conductive medium, and more particularly to a protective cover for a heat-conductive medium suitable for a heat sink apparatus.

2. Related Art

Electronic elements in the computer apparatus, such as central processing unit (CPU) chips and power integrated circuits (ICs), etc., generate heat when carrying out operations. The watt consumption of CPU chips has become higher and higher, and the high integrity of ICs also centralizes the heat source, such that not only does intense heat occur during the operation, but the resulting heat increases as the operation speed increases. Since the operation temperature has severe impact on whether the computer apparatus will crash or not, appropriate temperature control will provide the computer apparatus with high reliability and allow the heat-emitting electronic elements to operate stably.

In order to reduce the working temperature of the heat-emitting electronic elements while maintaining effective operation, various heat sink apparatuses are designed through the heat sinking design. The heat resistance of the surface can be reduced by closely contacting the heat sink apparatus with the heat-emitting electronic element, and the heat-conductive effect between the heat sink apparatus and the heat-emitting electronic element can be enhanced by coating a heat-conductive medium there-between.

As for manufacturers of heat sink apparatuses, a heat-conductive medium is generally arranged on a heat sink apparatus in advance, to facilitate shipment for the customer. However, during the transportation of heat sink apparatuses, it is rather easy for the heat-conductive medium to pollute the ambience, or to be scraped and squeezed by the surrounding objects. Thus, the heat-conductive medium must be sufficiently protected while transporting heat sink apparatuses.

U.S. Pat. No. 5,897,917 discloses a method for applying a protective membrane directly onto the bottom surface of a heat sink apparatus provided with a heat-conductive medium, to protect the heat-conductive medium. Although this method can prevent the heat-conductive medium from being polluted by the ambience and vice versa, the protective membrane directly contacted with the heat-conductive medium is likely to be squeezed to be deformed or scraped by ambient external forces during the transportation of the heat sink apparatus.

U.S. Pat. No. 6,049,458 discloses a protective cover body for a heat-conductive medium, wherein the central part of the cover body corresponds to a heat sink apparatus with a heat-conductive medium, while the edge of the cover body is adhered and secured to the bottom surface of the heat sink apparatus. Although deforming and scraping of the heat-conductive medium due to squeezing can be reduced in this way, an adhesive object tends to be attached on the surface of the heat sink apparatus when the cover body is torn off, resulting in a non-uniform surface of the heat sink apparatus, and work for clearing the adhesive object is required, such that the heat sink effect is greatly reduced. In addition, a poor adhesion occurs when the protective cover body is stuck onto the surface of the heat sink apparatus, thereby the protective cover body is unable to be firmly anchored and tends to fall off there-from, being unable to protect the heat-conductive medium.

SUMMARY OF THE INVENTION

In the above disclosed conventional technology, without fully considering scraping and deforming of the heat-conductive medium due to exterior squeezing during transportation, the heat-conductive effect is reduced after being placed in the heat sink apparatus, and the surface of the heat sink apparatus is also damaged, resulting in wearing off of the heat sink apparatus. In addition, as for the protective cover body for the heat-conductive medium adhered on the surface of the heat sink apparatus, a non-uniform surface of the heat sink apparatus tends to occur after the protective cover body is torn off, and the protective cover body cannot be recycled thus causing a waste, besides, a poor adhesion tends to occur and it cannot be firmly anchored thereon, such that it shifts and cannot protect the heat-conductive medium. In view of the above problems, the invention provides a structural design of a protective cover for the heat-conductive medium, suitable for the heat sink apparatus.

The protective cover for the heat-conductive medium disclosed in the invention is disposed on the bottom surface of the base for the heat sink apparatus to cover and protect the heat-conductive medium placed in the heat sink apparatus. The protective cover for the heat-conductive medium comprises a sheet-like board, an elastic wall, and an accommodation chamber, wherein the sheet-like board is concave; the elastic wall is extended along the edge of the sheet-like board so as to provide a clipping force for clipping with the heat sink apparatus; and the accommodation chamber is formed by the concave portion of the sheet-like board, while the sheet-like board and the heat sink apparatus are clipped together through the elastic wall, and then the sheet-like board is fixed on the heat sink apparatus with a locking screwing element of the heat sink apparatus, such that the accommodation chamber is used to mask and cover the heat-conductive medium.

Additionally, in the protective cover for the heat-conductive medium disclosed in the invention, the elastic wall of the sheet-like board also can be set as a star-like positioning hole, and a positioning element corresponding to the star-like positioning hole is disposed on the heat sink apparatus, and then the sheet-like board is fixed on the heat sink apparatus with the star-like positioning hole engaged with the positioning element, and accordingly the accommodation chamber can be used to mask and cover the heat-conductive medium.

The protective cover for the heat-conductive medium disclosed in the invention provides protection for the heat-conductive medium without being worn off, so as to ensure the heat sink effect of the heat sink apparatus. The elastic wall is disposed and extended along the edge of the sheet-like board, and a fastening portion is additionally disposed, which not only facilitates the operation, so as to clip with the heat sink apparatus quickly, but also enables the movement of the protective cover for the heat-conductive medium after being assembled to be completely limited in any direction and its bonding with the heat sink apparatus being secured so as to provide full course protection to the heat-conductive medium. Also, the protective cover for the heat-conductive medium can be recycled to be repeatedly used without too great a manufacturing cost.

In order to make the above-mentioned objects, features, and advantages of the invention more apparent, three examples are given below and further illustrated in detail with reference to the accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

In the protective cover for the heat-conductive medium disclosed in the invention, the so-called heat-conductive medium can be applied to a heat sink fin for heat dissipation, but is not limited to a heat sink fin, for example, the technique disclosed in this invention also can be applied to an interface providing an exothermic electronic element with heat transferring and heat dissipation. In the following detailed description of the invention, a heat sink fin will be taken as the embodiment of the invention.

Figure 1:
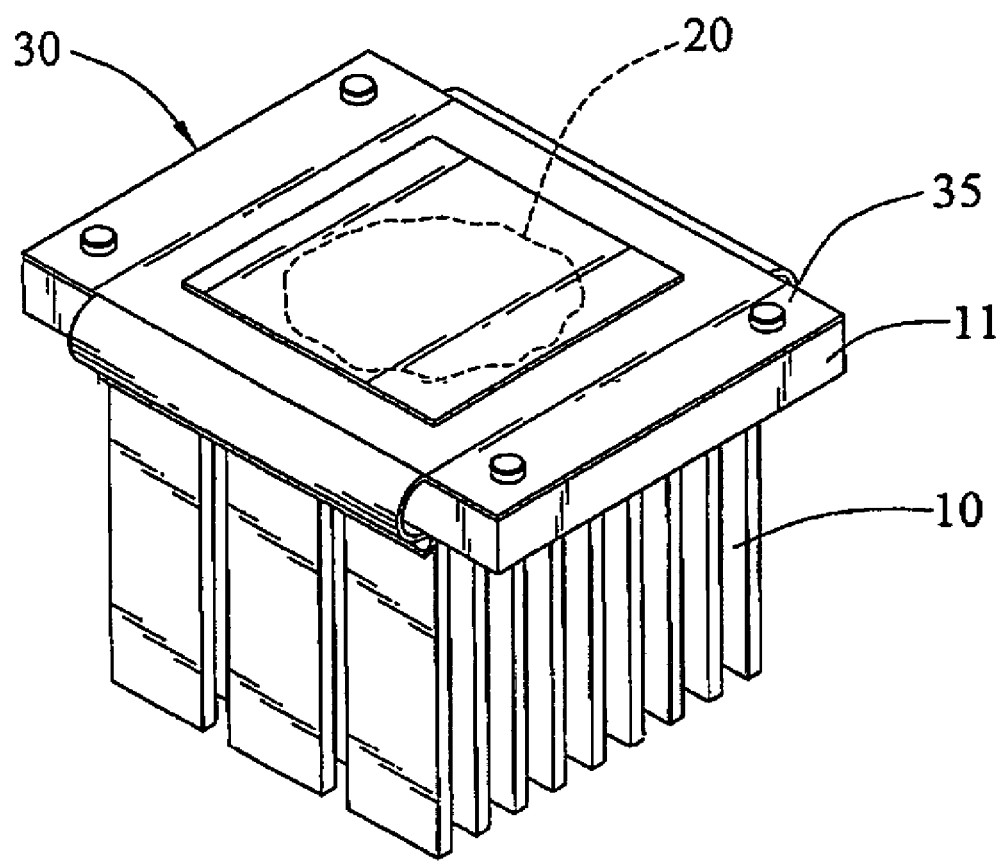
FIG. 1 is a combined stereogram of a using state of a first embodiment.

A first embodiment of the invention is shown in FIG. 1, wherein a heat sink fin 10 has a heat sink fin base 11 with a heat-conductive medium 20 placed on the bottom surface thereof, and a protective cover 30 for the heat-conductive medium is disposed on the heat-conductive medium 20 to cover and protect the heat-conductive medium 20.

Figure 2:
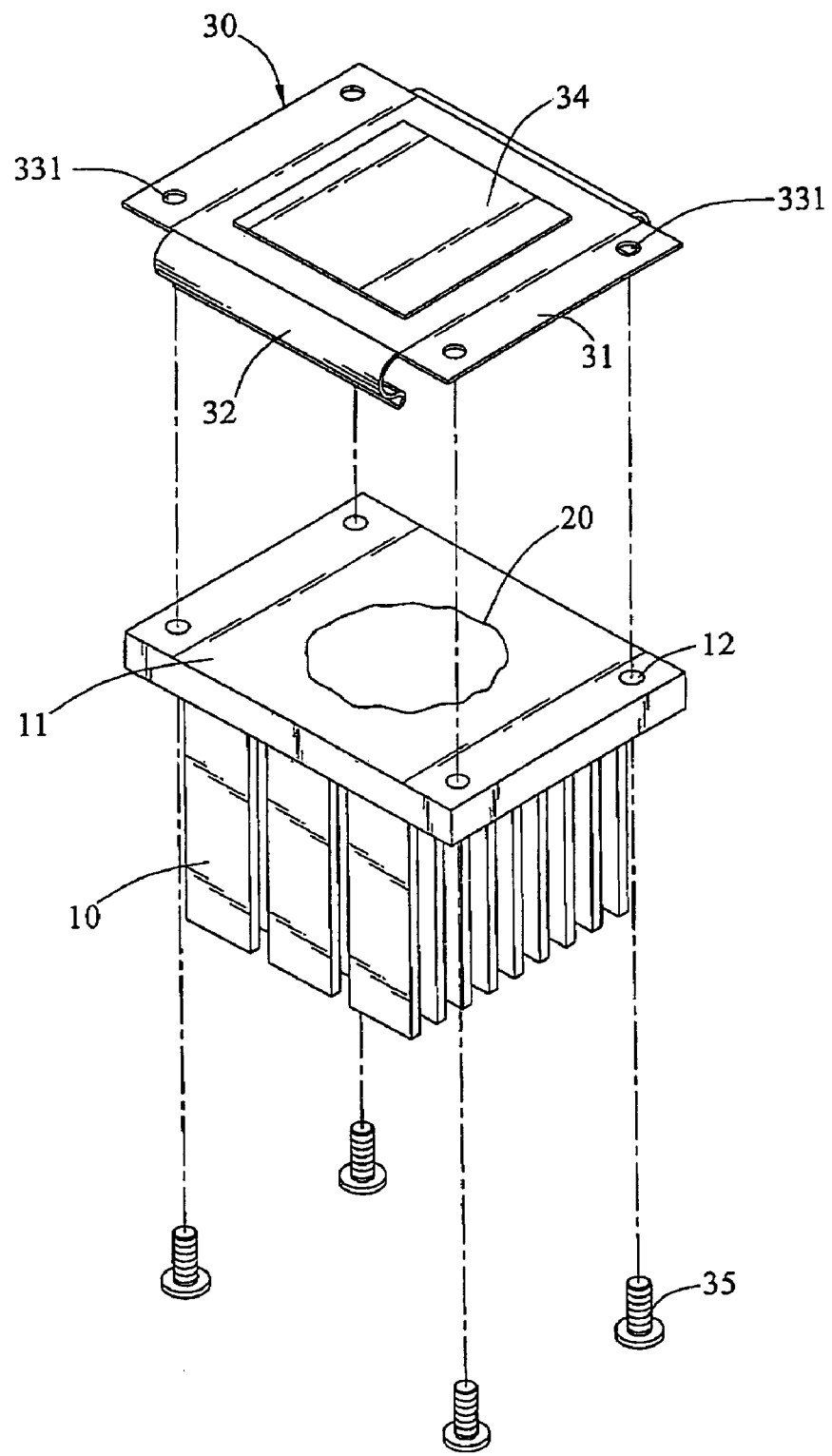
FIG. 2 is an exploded stereogram of a using state of the first embodiment.
Figure 3:
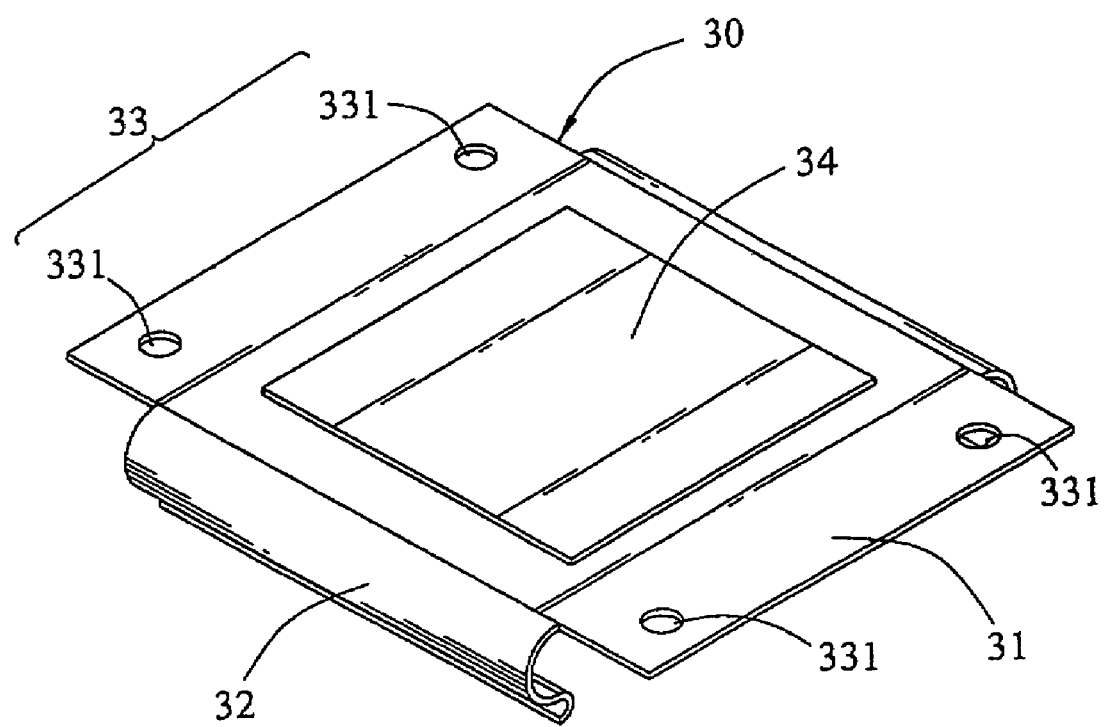
FIG. 3 is a schematic view of the appearance of the first embodiment.

Referring to FIGS. 2, 3, the heat-conductive medium 20 is placed on the bottom surface of the heat sink fin base 11 with a screwing hole 12 opened thereon. The protective cover 30 for the heat-conductive medium includes a sheet-like board 31, an elastic wall 32 extending along the edge of the sheet-like board 31. The sheet-like board 31 is provided with a fastening portion 33 and an accommodation chamber 34, wherein the fastening portion 33 has a through hole 331 corresponding to the screwing hole 12, and the accommodation chamber 34 protrudes outwards corresponding to the position of the heat-conductive medium 20, so as to mask and cover the heat-conductive medium 20.

When the protective cover 30 for the heat-conductive medium is mounted on the heat sink fin base 11, one side of the sheet-like board 31 moves towards the heat sink fin base 11, such that the elastic wall 32 can clip with the heat sink fin base 11, thus limiting the movement of the sheet-like board 31 in the Y, Z directions. After the sheet-like board 31 has clipped with the heat sink fin base 11, it only can move in the X direction relative to the heat sink fin base 11, and through this movement, the through hole 331 of the sheet-like board 31 can be aligned with the screwing hole 12, with the accommodation chamber 34 being located at the corresponding position for masking and covering the heat-conductive medium 20, and then the screwing hole 12 and the through hole 331 are bound together by using the screwing element 35 locked on the heat sink fin base 11, which further limits the movement of the sheet-like board 31 in the X direction relative to the heat sink fin base 11 such that the sheet-like board 31 is fixed on the heat sink fin base 11, thereby the accommodation chamber 34 is accordingly used to mask and cover the heat-conductive medium 20.

Figure 4:
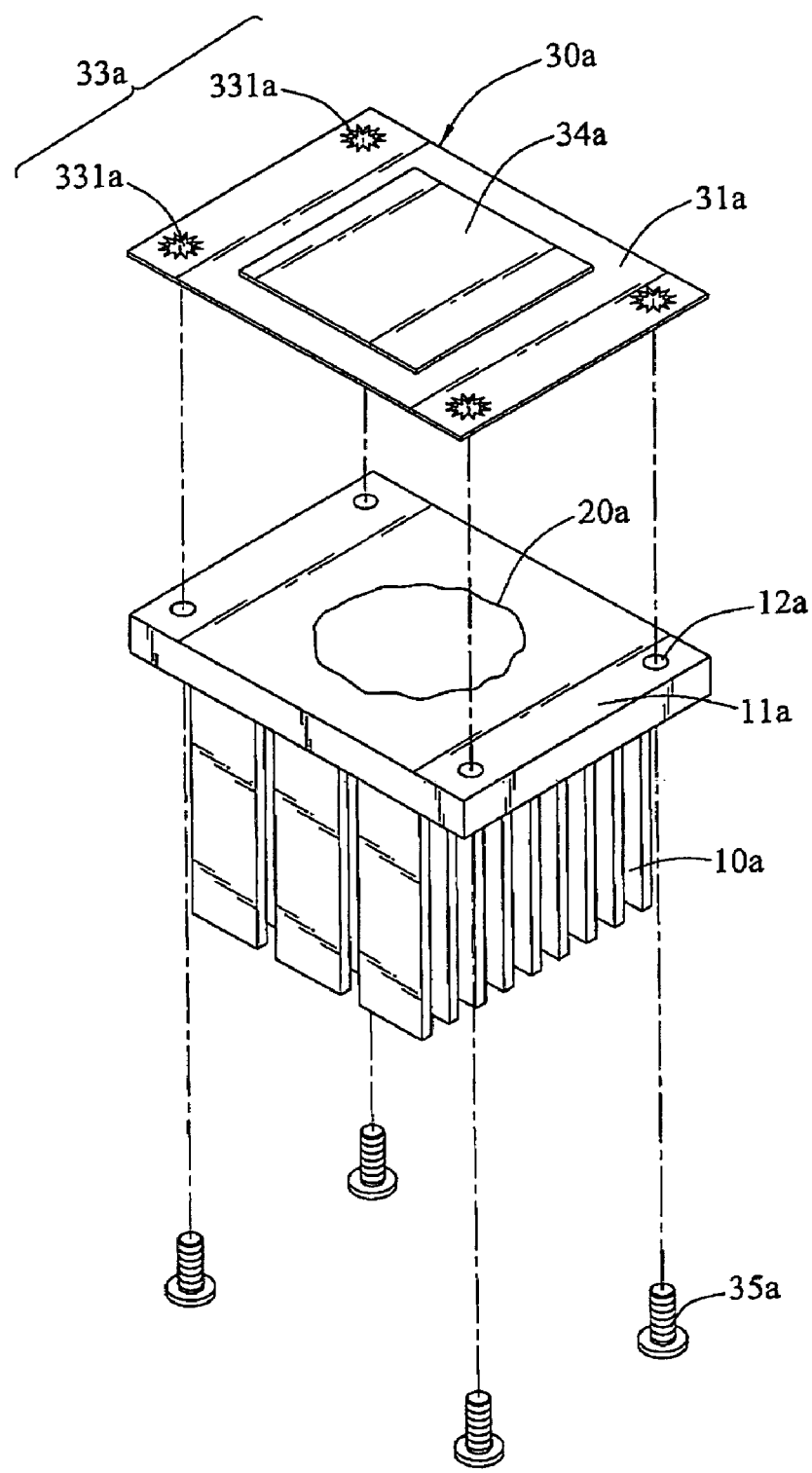
FIG. 4 is an exploded stereogram of a using state of a second embodiment.

A second embodiment of the invention is shown in FIG. 4, wherein a heat-conductive medium 20a is placed on the bottom surface of a heat sink fin base 11a with a screwing hole 12a opened thereon; a protective cover 30a for the heat-conductive medium includes a sheet-like board 31a with a star-like positioning hole 331a corresponding to the screwing hole 12a; and the accommodation chamber 34a protrudes outwards corresponding to the position of the heat-conductive medium 20a for masking and covering the heat-conductive medium 20a.

When the protective cover 30a for the heat-conductive medium is mounted on the heat sink fin base 11a, one side of the sheet-like board 31a moves towards the heat sink fin base 11a, such that both of them can be engaged with each other so as to limit the movement of the sheet-like board 31a in the X, Y, and Z directions. The star-like positioning hole 331a of the sheet-like board 31a is aligned with the screwing hole 12a, with the accommodation chamber 34a being located at the corresponding position for masking and covering the heat-conductive medium 20a, and then the screwing hole 12a and the star-like positioning hole 331a are bound together through the screwing element 35a locked on the heat sink fin base 11a, such that the sheet-like board 31a is fixed on the heat sink fin base 11a, thereby the accommodation 34a is used for masking and covering the heat-conductive medium 20a.

Figure 5:
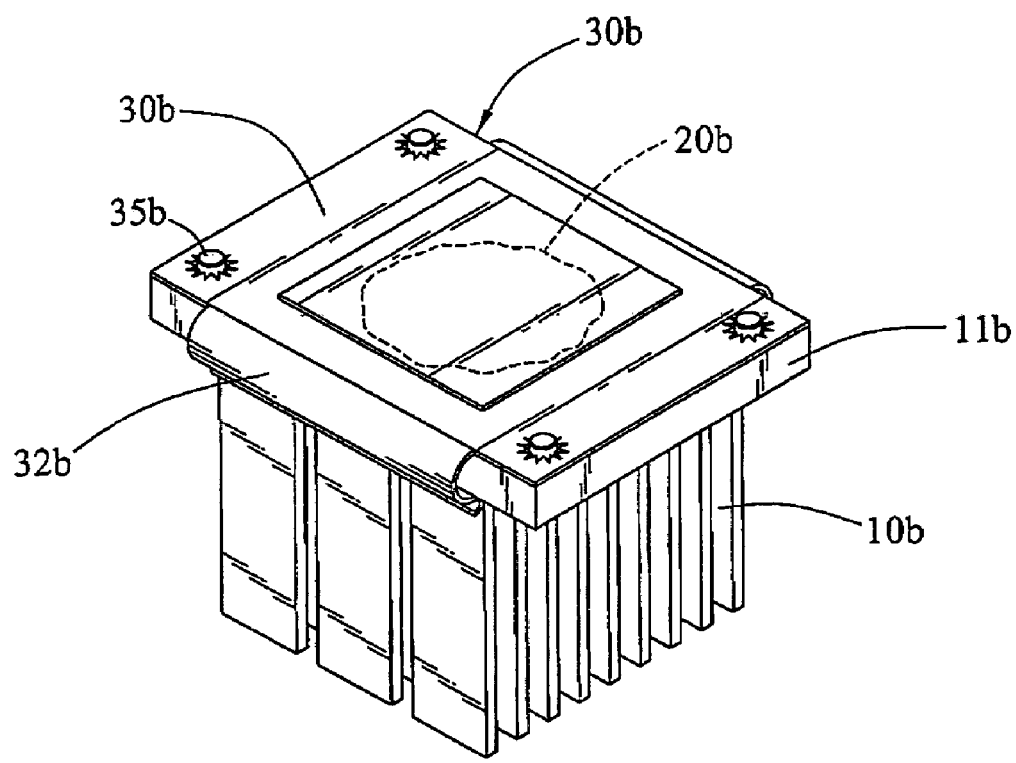
FIG. 5 is a combined stereogram of a using state of a third embodiment.

A third embodiment of the invention is shown in FIG. 5, wherein a heat sink fin 10b has a heat sink fin base 11b with a heat-conductive medium 20b placed on the bottom surface, and a protective cover 30b for the heat-conductive medium is disposed on the heat-conductive medium 20b to cover and protect the heat-conductive medium 20b.

Figure 6:
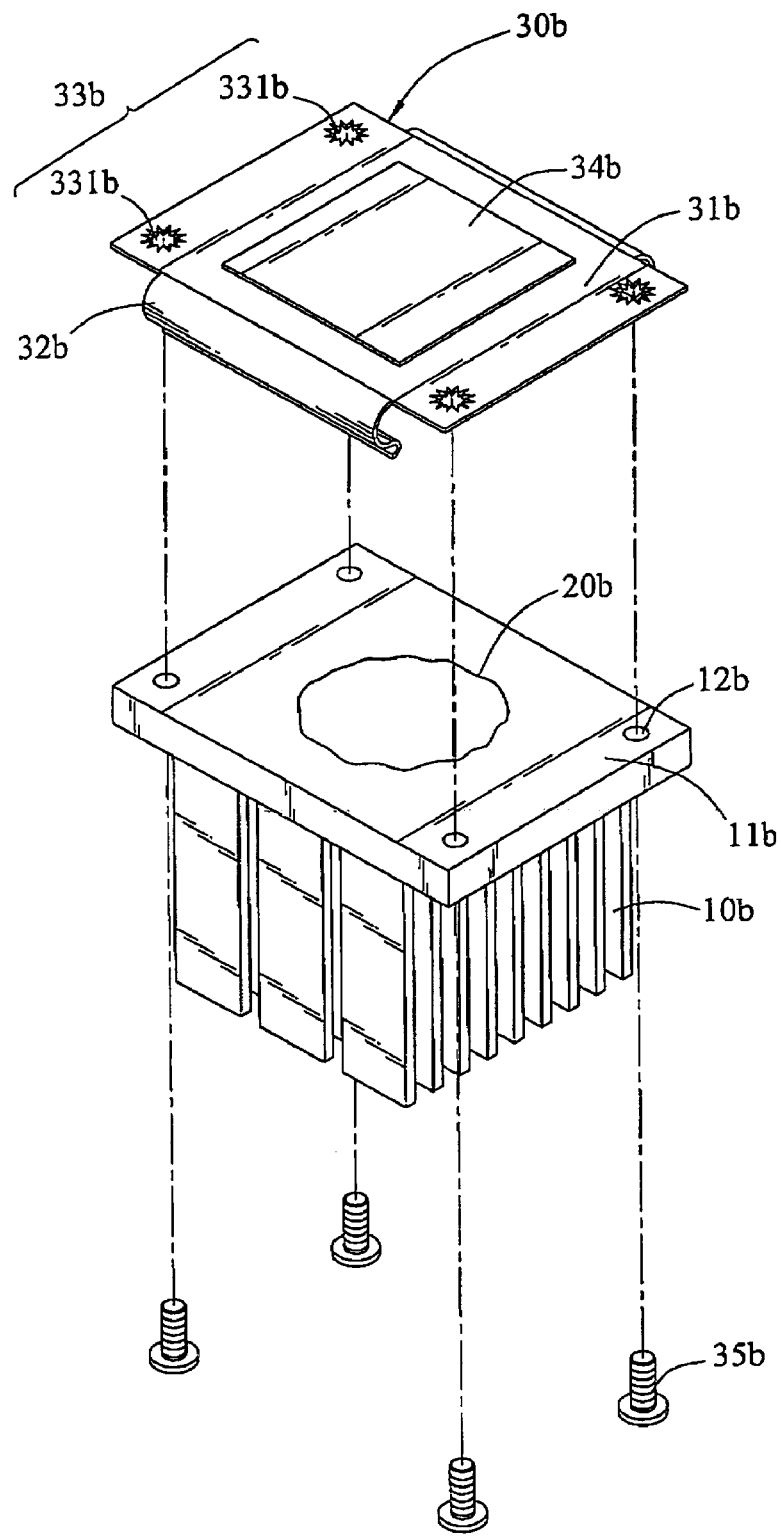
FIG. 6 is an exploded stereogram of a using state of the third embodiment.

Referring to FIG. 6, the heat-conductive medium 20b is placed on the bottom surface of the heat sink fin base 11b with a screwing hole 12b opened thereon. The protective cover 30b for the heat-conductive medium includes a sheet-like board 31b with an elastic wall 32b extending along the edge. The sheet-like board 31b is provided with a fastening portion 33b and an accommodation chamber 34b, wherein the fastening portion 33b is provided with a star-like positioning hole 331b corresponding to the screwing hole 12b; and the accommodation chamber 34b protrudes outwards corresponding to the position of the heat-conductive medium 20b for masking and covering the heat-conductive medium 20b.

When the protective cover 30b for the heat-conductive medium is mounted on the heat sink fin base 11b, one side of the sheet-like board 31b moves towards the heat sink fin base 11b, such that the elastic wall 32b can clip with the heat sink fin base 11b, and meanwhile the star-like positioning hole 331b of the sheet-like board 31b is aligned with the screwing hole 12b for the screwing hole 12b to pass through, together with the screwing element 35b locked on the heat sink fin base 11*b*, so as to limit the movement of the sheet-like board 31*b* in the X, Y, and Z directions. After the sheet-like board 31*b* is clipped with the heat sink fin base 11*b*, the sheet-like board 31*b* is fixed on the heat sink fin base 11*b*, thereby the accommodation chamber 34*b* is used to mask and cover the heat-conductive medium 20*b*.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A protective cover structure for a heat-conductive medium of a heat sink apparatus, used for covering and protecting the heat-conductive medium placed on the bottom surface of the heat sink apparatus, comprising:
   a sheet-like board, being concave and located at one side of the protective cover for the heat-conductive medium;
   an elastic wall, extending along the edge of the sheet-like board so as to provide a clipping force to clip with the heat sink apparatus; and
   an accommodation chamber, formed by the concave portion of the sheet-like board for masking and covering the heat-conductive medium.

2. The protective cover structure for a heat-conductive medium as claimed in claim 1, wherein the sheet-like board can be any geometric shape selected from round, rectangle, triangle, and trapezium.

3. The protective cover structure for a heat-conductive medium as claimed in claim 1, wherein the sheet-like board is provided with a fastening portion, such that the fastening portion is used to fix the sheet-like board onto the heat sink apparatus through a screwing element correspondingly locked on the heat sink apparatus.

4. The protective cover structure for a heat-conductive medium as claimed in claim 3, wherein the fastening portion is provided with a through hole.

5. The protective cover structure for a heat-conductive medium as claimed in claim 3, wherein the fastening portion is provided with a star-like positioning hole for the screwing element to pass through.

6. The protective cover structure for a heat-conductive medium as claimed in claim 3, wherein the screwing element is a screw.

7. The protective cover structure for a heat-conductive medium as claimed in claim 1, wherein the area of the accommodation chamber is not smaller than that of the heat-conductive medium.

8. The protective cover structure for a heat-conductive medium as claimed in claim 1, wherein the accommodation chamber protrudes outwards corresponding to the position of the heat-conductive medium, so as to mask and cover the heat-conductive medium.

9. A protective cover structure for a heat-conductive medium of a heat sink apparatus, used for covering and protecting the heat-conductive medium placed on the bottom surface of the heat sink apparatus, comprising:
   a sheet-like board, being concave and located at one side of the protective cover for the heat-conductive medium;
   a star-like positioning hole, disposed on the sheet-like board to provide a clipping force to clip with the heat sink apparatus; and
   an accommodation chamber, formed by the concave portion of the sheet-like board to mask and cover the heat-conductive medium.

10. The protective cover structure for a heat-conductive medium as claimed in claim 9, wherein the sheet-like board is any geometric shape selected from round, rectangle, triangle, and trapezium.

11. The protective cover structure for a heat-conductive medium as claimed in claim 9, wherein the star-like positioning hole is used to fix the sheet-like board onto the heat sink apparatus through a screwing element correspondingly locked on the heat sink apparatus.

12. The protective cover structure for a heat-conductive medium as claimed in claim 11, wherein the screwing element is a screw.

13. The protective cover structure for a heat-conductive medium as claimed in claim 9, wherein the area of the accommodation chamber is not smaller than that of the heat-conductive medium.

14. The protective cover structure for a heat-conductive medium as claimed in claim 9, wherein the accommodation chamber protrudes outwards corresponding to the position of the heat-conductive medium so as to mask and cover the heat-conductive medium.

* * * * *